US012645250B2

(12) United States Patent
Patel et al.

(10) Patent No.: US 12,645,250 B2
(45) Date of Patent: Jun. 2, 2026

(54) APPARATUSES AND METHODS TO FACILITATE A REDUCTION IN AREA AND POWER CONSUMPTION OF CIRCUITS AND SYSTEMS VIA CLOCK-GATING AND AN IDENTIFICATION OF QUALIFIERS

(71) Applicant: NXP B.V., Eindhoven (NL)

(72) Inventors: Sagarkumar Jagdishkumar Patel, Gandhinagar (IN); Sakshi Sharma, Jalandhar (IN); Ashutosh Kumar, greater Noida (IN); Nidhi Puri, Gurgaon (IN); Love Gupta, Noida (IN)

(73) Assignee: NXP B.V., Eindhoven (NL)

( * ) Notice: Subject to any disclaimer, the term of this patent is extended or adjusted under 35 U.S.C. 154(b) by 388 days.

(21) Appl. No.: 18/352,574

(22) Filed: Jul. 14, 2023

(65) Prior Publication Data

US 2024/0385644 A1     Nov. 21, 2024

(30) Foreign Application Priority Data

May 19, 2023    (IN) .............................. 202341035106

(51) Int. Cl.
*G06F 1/12*        (2006.01)
*G06F 30/396*      (2020.01)
(52) U.S. Cl.
CPC .............. *G06F 1/12* (2013.01); *G06F 30/396* (2020.01)
(58) Field of Classification Search
CPC .................. G06F 1/32; G06F 1/12; G06F 9/44
See application file for complete search history.

(56) References Cited

U.S. PATENT DOCUMENTS

| | | | |
|---|---|---|---|
| 11,159,148 B1 * | 10/2021 | Moheban .................. | G06F 5/06 |
| 2004/0257139 A1 | 12/2004 | Shelor | |
| 2008/0079460 A1 * | 4/2008 | Veredas-Ramirez ......................... | H03K 19/17796 326/41 |
| 2008/0301593 A1 | 12/2008 | Jiang et al. | |

OTHER PUBLICATIONS

"Genus Low Power", Cadence Design Systems, Inc., Aug. 2021, 244 pages.
Shinde , et al., "Clock Gating—A Power Optimizing Technique for VLSI Circuits", 2011, 4 pages.
Sudhakar et al., "GFCG: Glitch free combinational clock gating approach in nanometer VLSI circuits", 2015 2nd International Conference on Electronics and Communication Systems (ICECS), IEEE, Feb. 26, 2015, pp. 146-150.

* cited by examiner

*Primary Examiner* — Keshab R Pandey

(57)        ABSTRACT

Aspects of the subject disclosure address the traditional trade-off between performance and area, in relation to circuit and system design, together with power as an additional factor of consideration. Circuits and systems of this disclosure may realize a datapath of data in respect of memory state elements (e.g., registers, flops, etc.) that is dependent on multiple qualifiers. Aspects of this disclosure enhance (e.g., optimize) area and reduce leakage power associated with circuits and systems. Furthermore, aspects of this disclosure enable and enhance an insertion of clock-gating circuits or mechanisms to reduce dynamic-power consumption depending on states of the qualifiers.

16 Claims, 9 Drawing Sheets

100

200a

<u>200b</u> fast_data[n-1:0]

normal_data[n-1:0]

priority_enable fast_enable normal_enable clk

220d

230d

210d state_reg[n-1:0]

200d fast_data[n-1:0]

normal_data[n-1:0]

priority_enable fast_enable normal_enable clk

210e

220e state_reg[n-1:0]

244e

200e

202f fast_data[n-1:0]

fast_enable normal_data[n-1:0]

normal_enable priority_enable

206f state_reg[n-1:0]

clk

204f

200f

Identify Application/
Function/Service
Requirements — 306

Identify Qualifiers
Impacting Data;
Obtain Truth Table — 312

Identify Clock-Gating
Opportunities — 318

Synthesize
Circuit/System — 324

Implement Circuit/
System — 330

300

APPARATUSES AND METHODS TO FACILITATE A REDUCTION IN AREA AND POWER CONSUMPTION OF CIRCUITS AND SYSTEMS VIA CLOCK-GATING AND AN IDENTIFICATION OF QUALIFIERS

CROSS-REFERENCE TO RELATED APPLICATIONS

This application claims the priority under 35 U.S.C. § 119 of India patent application Ser. No. 202341035106, filed on 19 May 2023, the contents of which are incorporated by reference herein.

FIELD OF THE DISCLOSURE

The subject disclosure relates to apparatuses and methods to facilitate a reduction in area and power consumption of circuits and systems via clock-gating and an identification of qualifiers.

BACKGROUND

Various advances in circuit design and fabrication/manufacture have facilitated a wide range of applications. Furthermore, flexibility is obtained via programmable logic, firmware, and the like, whereby features of applications and services may be modified or adapted over time to meet changes in requirements, conditions, etc. Many modern applications and services are facilitated via sophisticated systems that combine various logic elements or functions. Frequently, and in view of enhancements in technology, many such systems can fit within a housing/casing of a chip (and are referred to as a system on chip, or SoC for short).

Manufacturers frequently encounter trade-offs between a performance of a device (e.g., an SoC) and an area consumed by the associated logic/functionality supported by the device. These trade-offs are compounded by the addition of power as a parameter that needs to be considered. For example, and to ensure device reliability and longevity, it is generally desirable to reduce the power consumption/dissipation of the device, as doing so can reduce the thermal profile of the device. In general, reductions in the area or materials of a device consumed by logic to support given functionality will enhance the (overall) efficiency and operational lifetime of the device.

BRIEF DESCRIPTION OF THE DRAWINGS

Reference will now be made to the accompanying drawings, which are not necessarily drawn to scale, and wherein.

DETAILED DESCRIPTION

The subject disclosure describes, among other things, illustrative embodiments for reducing power consumption and an amount of logic that is utilized in implementing applications, functions, and services in connection with one or more systems and circuits. Other embodiments are described herein.

One or more aspects of the subject disclosure include, in whole or in part, a plurality of memory-state elements; a plurality of multiplexers, wherein each multiplexer of the plurality of multiplexers interfaces to a corresponding memory-state element of the plurality of memory-state elements, wherein each multiplexer of the plurality of multiplexers includes at least two data inputs, and wherein the at least two data inputs of each multiplexer are associated with a datapath of data having an associated plurality of qualifiers; and a clock-gated circuit that generates a first output that is coupled to a clock input of each of the plurality of memory-state elements.

One or more aspects of the subject disclosure include, in whole or in part, a plurality of flip-flops; first logic that provides respective data at a first input of each flip-flop of the plurality of flip-flops, wherein the first logic does not obtain outputs of the flip-flops as inputs; and second logic that clock-gates a clock signal in respect of a second input of each of the plurality of flip-flops.

One or more aspects of the subject disclosure include, in whole or in part, identifying, by a processing system including a processor, a plurality of qualifiers that impact data of an application, resulting in a first identification; identifying, by the processing system and based on the first identification, at least one clock-gating opportunity in respect of a circuit to implement the application, resulting in a second identification; and synthesizing, by the processing system and based on the second identification, the circuit.

Figure 1:
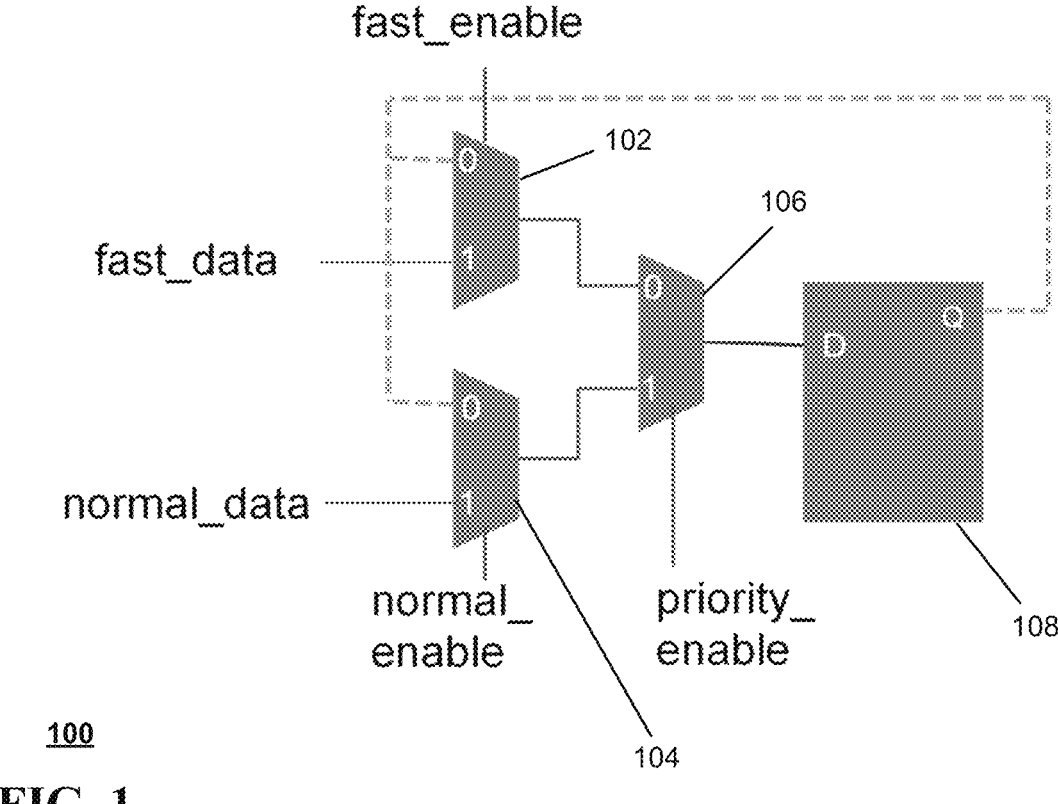
FIGS. 1 and 2A-2F are diagrams illustrating example, non-limiting embodiments of systems in accordance with various aspects described herein.

Referring now to FIG. 1, a system 100 incorporating various aspects of this disclosure is shown. The system 100 may correspond to a portion/part of a circuit that may support functionality of one or more applications or services. The system 100 may include a number of components, such as for example a first multiplexer (mux) 102, a second mux 104, a third mux 106, and a register, memory-state element, or the like, illustratively represented as a D-type flip-flop 108. While a D-type flip-flop is shown in FIG. 1, one skilled in the art will appreciate that other types or kinds of memory-state elements (such as, for example, a toggle flip-flop, a J-K flip-flop, etc.) may be used in practical applications of this disclosure.

The system 100 may be arranged in the manner shown. For example, an output of the first mux 102 may serve as a first input to the third mux 106 and an output of the second mux 104 may serve as a second input to the third mux 106. An output of the third mux 106 may serve as an input ('D') to the flip-flop 108. An output ('Q') of the flip-flop 108 may serve as a first input to each of the first mux 102 and the second mux 104. A second input of the first mux 102 may correspond to first data (labeled as fast_data in FIG. 1) and a second input of the second mux 104 may correspond to second data (labeled as normal_data in FIG. 1). One skilled in the art will appreciate that the arrangement shown in FIG. 1 is exemplary, which is to say that other arrangements may be utilized as part of this disclosure. The labels "fast_data" and "normal_data" in, e.g., FIG. 1 are intended to signify that a rate or frequency associated with the first data may be greater than a rate or frequency associated with the second data as part of a given application. Of course, this might not necessarily be the case in another application or variant of the system 100.

Each of the muxes 102-106 is modeled in FIG. 1 as a two-to-one (2-1) mux, meaning that each of the muxes 102-106 obtains two inputs (labeled '0' and '1') and generates an output corresponding to one of the inputs. In this regard, each of the muxes 102-106 may include an input corresponding to a select or control line to facilitate a selection of one of the two inputs. For example, the first mux 102 may be coupled to a first select/control signal (labeled as fast_enable in FIG. 1), the second mux 104 may be coupled to a second select/control signal (labeled as normal_enable in FIG. 1), and the third mux 106 may be coupled to a third select/control signal (labeled as priority_enable in FIG. 1).

Figure 2A:
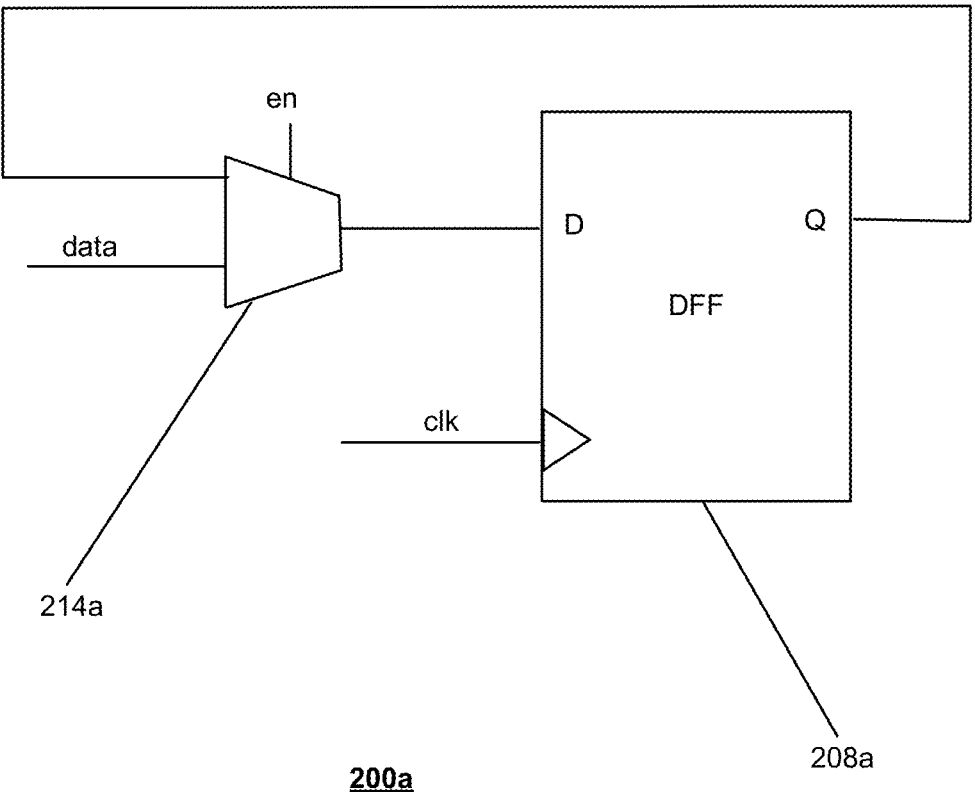
Figure 2B:
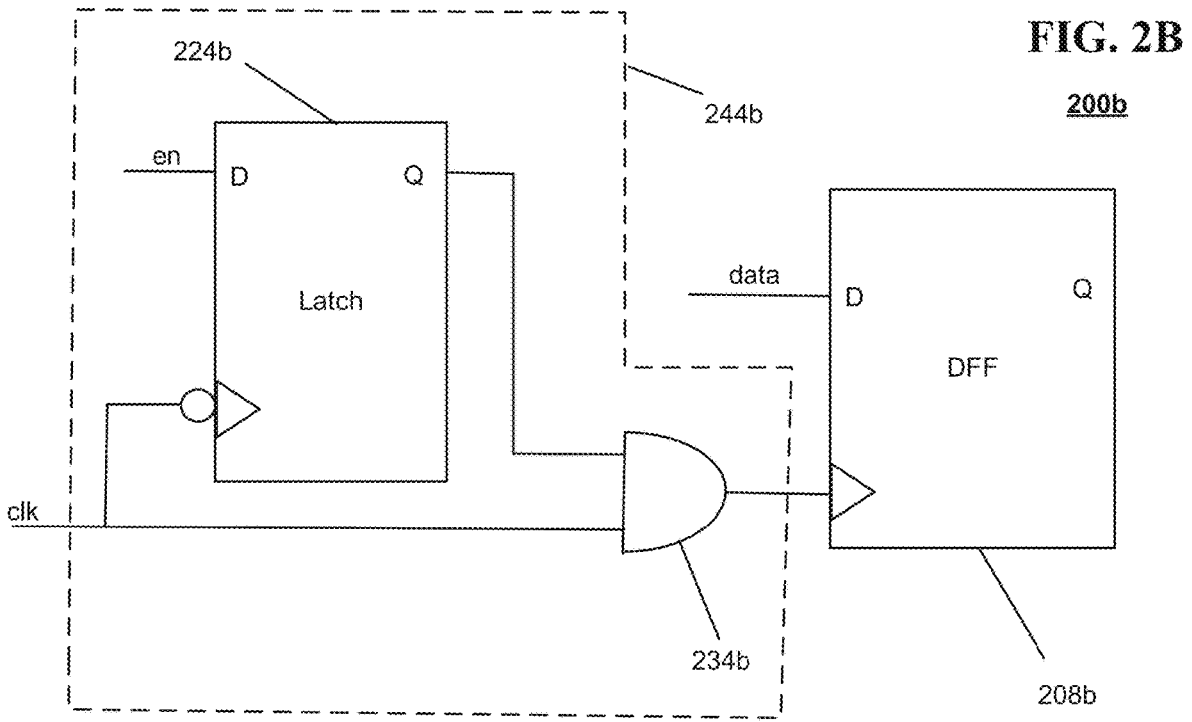

Briefly referring to FIGS. 2A and 2B, systems 200a and 200b are shown, respectively. Aspects of the systems 200a and 200b may be combined with, or operatively overlaid upon, one or more parts/portions of the system 100 of FIG. 1. The system 200a may include a D-type flip-flop (DFF) 208a and a mux 214a, where an output of the mux 214a may provide an input ('D') to the DFF 208a. An output ('Q') of the DFF 208a may serve as a first input to the mux 214a and a second input of the mux 214a may correspond to data. Another input (e.g., enable or 'en' for short) to the mux 214a may control a selection of the output of the mux 214a as between the output ('Q') of the DFF 208a and the data. The DFF 208a may transfer the value at the input ('D') to the output ('Q') (or, analogously, from the input to a memory-state element of the DFF 208a that drives/provides the output 'Q') on a rising edge of a clock signal ('clk').

As one skilled in the art will appreciate, the nature of the clock signal ('clk') in the system 200a may cause an appreciable amount of power (e.g., dynamic power) to be consumed by the system 200a (e.g., by the DFF 208a). In many practical applications, the nature of the data that is input to the mux 214a may be such that it changes relatively slowly (e.g., less than a threshold), such that it is largely immaterial whether the mux 214a utilizes the first input ('Q') or the second input ('data') in generating its own output.

In this respect, the system 200b of FIG. 2B may represent an alternative to the system 200a of FIG. 2A, whereby a latch 224b and an 'AND' gate 234b effectively serve to replace the mux 214a of FIG. 2A (it is noted that the DFF 208b of FIG. 2B may correspond to (an instance of) the DFF 208a of FIG. 2A). By virtue of the arrangement shown in FIG. 2B, the data at the input ('D') of the DFF 208b may be precluded or prevented from being transferred to the output ('Q') (or, analogously, the memory-state element) of the DFF 208b until the enable signal ('en') has a value of '1' (and is clocked-over to the output 'Q' of the latch 224b by virtue of a falling edge of the clock signal 'clk') and the clock signal ('clk') has a value of '1' (and the output of the AND gate 234b corresponds to a rising edge, which is an opposite polarity of the falling edge triggering mechanism of the latch 224b). The dynamic power consumed by the latch 224b may be less than the dynamic power consumed by the DFF 208b (or, analogously, the DFF 208a). Thus, the system 200b may represent an enhancement relative to the system 200a in terms of reducing power consumption/dissipation. The system 200b may be referred to herein as a clock-gated (CG) system that includes a clock-gated circuit as represented by the components contained within the box 244b shown in FIG. 2B.

Referring back to FIG. 1, it is understood and appreciated that the system 100 may be a candidate for power consumption/dissipation reduction in accordance with principles of CG systems as set forth above. To demonstrate, and as one of skill in the art will appreciate, the input 'D' of the flip-flop 108 may correspond to one of: the output 'Q' of the flip-flop 108, the fast_data, or the normal_data, based on the values of the control/enable signals priority_enable, fast_enable, and normal_enable provided to the muxes 102-106. Table 1 shown below corresponds to a truth table demonstrating the value of the input 'D' to the flip-flop 108 based on the various combinations of the control/enable signals.

TABLE 1

| Truth Table For The System 100 Of FIG. 1 | | | |
|---|---|---|---|
| priority_enable | fast_enable | normal_enable | 'D' |
| 0 | 0 | 0 | Q |
| 0 | 0 | 1 | Q |
| 0 | 1 | 0 | fast_data |
| 0 | 1 | 1 | fast_data |
| 1 | 0 | 0 | Q |
| 1 | 0 | 1 | normal_data |
| 1 | 1 | 0 | Q |
| 1 | 1 | 1 | normal_data |

As Table 1 above demonstrates, for half of the combinations of the control/enable signals provided to the muxes 102-106 the value of 'D' of the flip-flop 108 corresponds to the the value of 'Q' of the flip-flop 108. Each of the instances where the value of 'D' corresponds to the value of 'Q' is a candidate for clock-gating via CG systems/circuitry. If one assumed an equal probability of any one of the eight combinations of the control/enable signals shown in Table 1 occurring, a use of clock-gating would yield approximately 50% in (dynamic) power savings, which even of itself is significant. However, it has been determined that in many practical applications the statistical likelihood of obtaining one of the combinations of the control/enable signals that yields a value of 'D' equal to the value of 'Q' is greater than 50%; e.g., experimentation and analyses have shown that practical applications may provide combinations of the control/enable signals that yield a value of 'D' equal to the value of 'Q' in Table 1 occurring on the order of approximately 90% of the time.

Figure 2C:
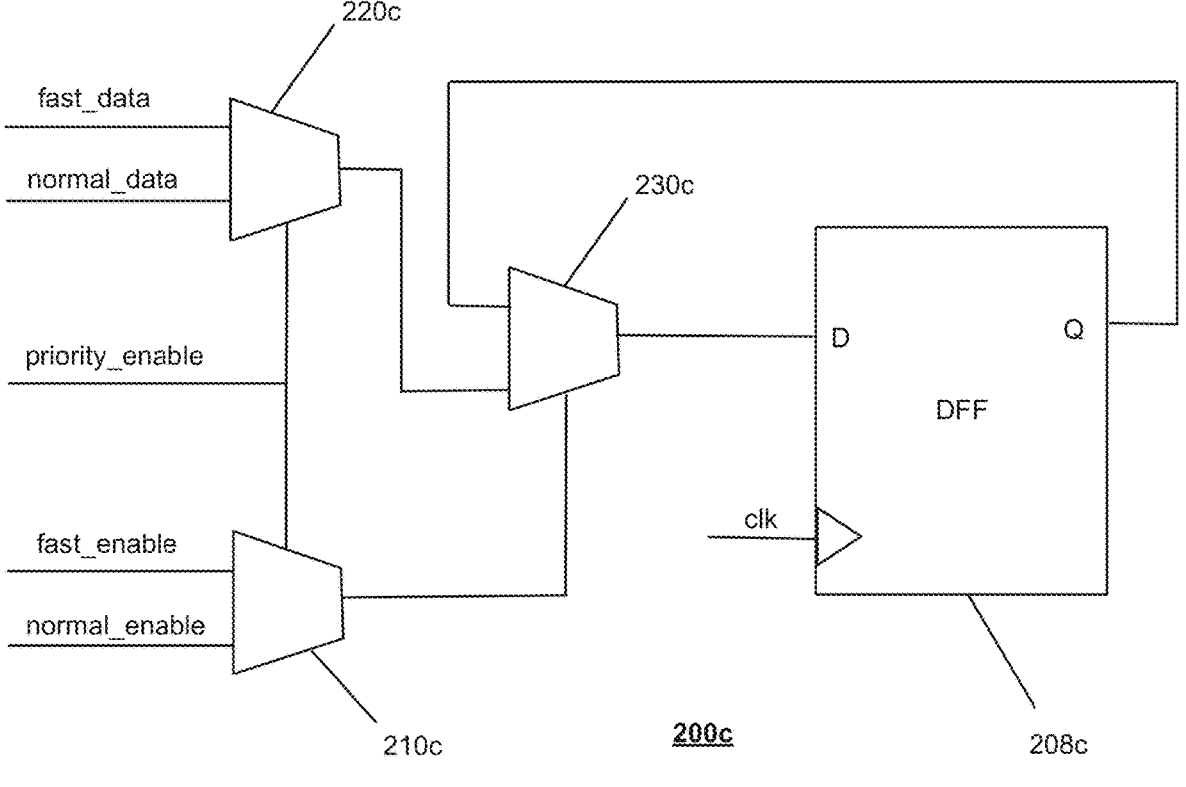

To help facilitate a use of CG systems/circuits in respect of the system 100 of FIG. 1, a counterpart system 200c is shown in FIG. 2C. The system 200c incorporates the same control/enable signals as the system 100—namely, 'priority_enable', 'fast_enable', and 'normal_enable'—in respect of the muxes 210c, 220c, and 230c shown in FIG. 2C. Furthermore, the system 200c incorporates the first data ('fast_data') and the second data ('normal_data') of the system 100.

Each of the muxes 210c-220c corresponds to a two-to-one (2-1) mux. The two inputs to the mux 210c correspond to fast_enable and normal_enable, the two inputs to the mux 220c correspond to fast_data and normal_data, and the two inputs to the mux 230c correspond to an output ('Q') of a DFF 208c (where the DFF 208c may correspond to (an instance of) the flip-flop 108) and the output of the mux 220c. Each of the muxes 210c and 220c have a control/enable input that is driven from priority_enable. The control/enable input of the mux 230c is driven from the output of the mux 210c.

Assuming that for each of the muxes 210c-230c that the top-most input (e.g., fast_enable in the case of the mux 210c) is selected as the output of the mux when the respective control/enable input is equal to '0' and the bottom-most input (e.g., normal_enable in the case of the mux 210c) is selected as the output of the mux when the respective control/enable input is equal to '1', the value presented at the input 'D' of the DFF 208c will adhere to the truth table of Table 1 shown above. Stated differently, the truth table of Table 1 above maps to the topology of the system 200c shown in FIG. 2C.

Figure 2D:
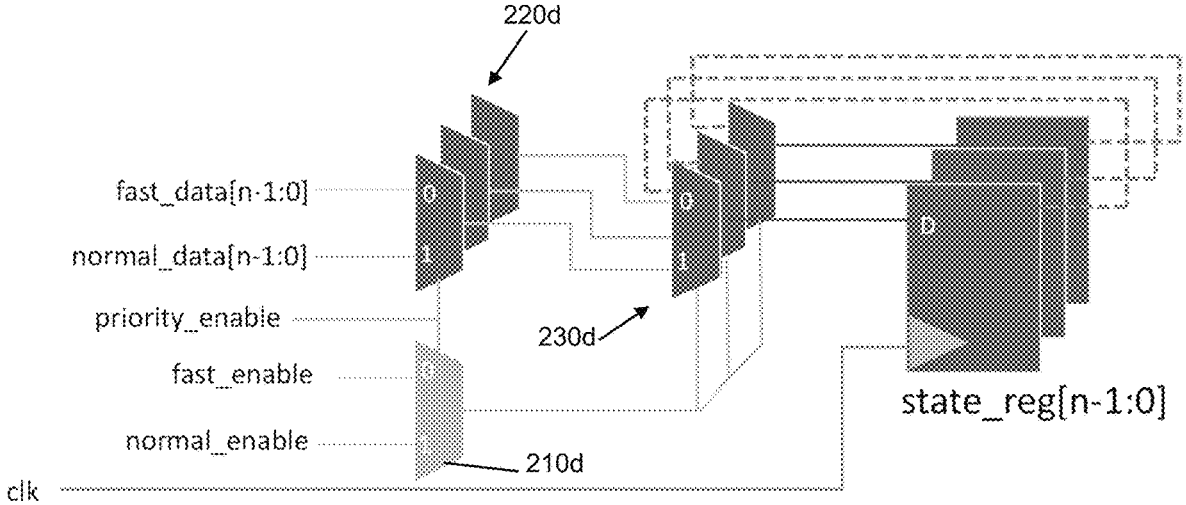

In view of the topologies of the circuits and systems described above as shown in FIGS. 1 and 2A-2C, reference may now be made to FIG. 2D, which depicts an illustrative embodiment of a system 200d in accordance with aspects of this disclosure. In particular, the system 200d may represent an extension upon the system 200c, whereby an array (e.g., a number 'N') of state registers (state_reg) is provided. Each member of the array of the N state registers may correspond to an instance of the DFF 208c shown in FIG. 2C. Each member of the array of the N state registers may be referenced via a respective index ranging from, e.g., n=0 to n=N−1. Furthermore, a comparison of FIG. 2C and FIG. 2D yields an indication that instances of the muxes 220c and 230c may be replicated, once for each element of the array, as represented by reference characters 220d and 230d, respectively. The mux 210c may be carried forward as the mux 210d shown in FIG. 2D.

The system 200d may utilize (2*N)+1 (e.g., two times 'N' plus one) muxes. For an appreciably large number N (which may be indicative of a use of the system 200d in many practical applications), the mux 210d may essentially be ignored in the count, which is to say that the system 200d uses approximately 2*N muxes. In contrast, the system 200e of FIG. 2E uses only N+1 (e.g., 'N' plus one) muxes. Ignoring the contribution of the mux 210c in FIG. 2E to the count of muxes (where the mux 210e may correspond to the mux 210d of FIG. 2D, and assuming that the array of muxes 220e corresponds to (an instance of) the array of muxes 220d) when the value of 'N' is large (at least equal to ten, although practical applications may utilize upwards of 72 (or even more) for the value of 'N'), the number of muxes in the system 200e is approximately equal to N. Thus, the system 200c represents approximately a 50% reduction in terms of the count of muxes that are used relative to the system 200d.

Figure 2E:
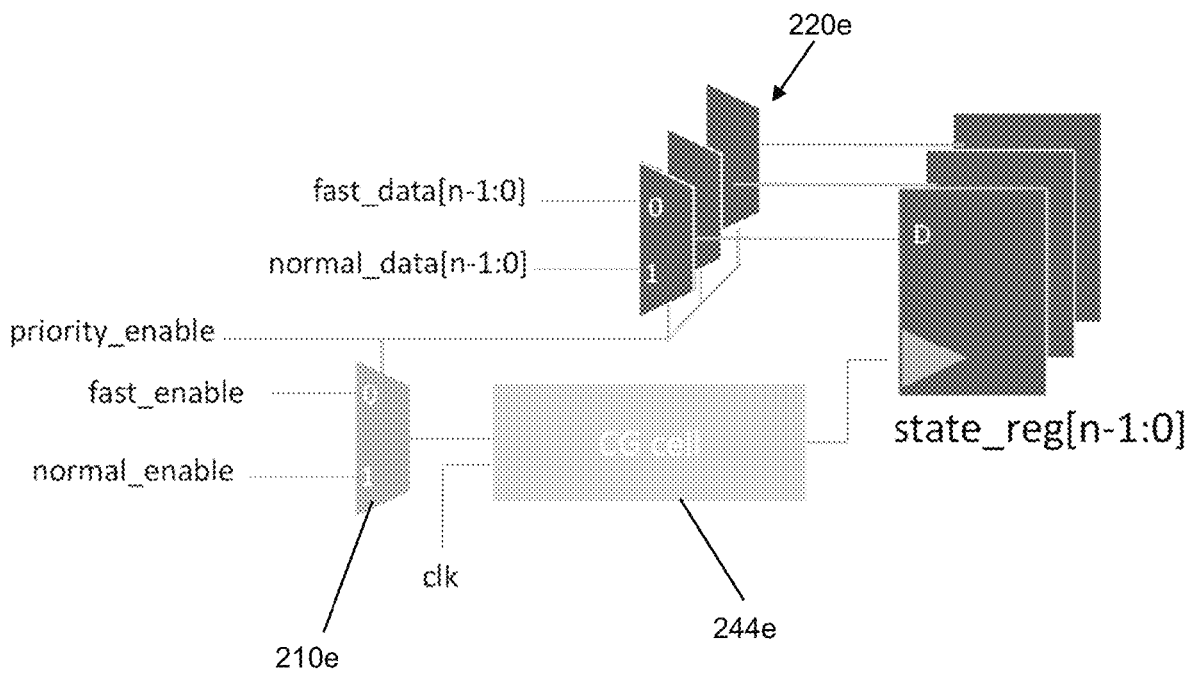

The reduction of 50% referenced above (in terms of a comparison of the system 200d and the system 200e) may be realized/obtained by virtue of a use of the CG circuit/cell 244e in FIG. 2E, where the circuit/cell 244c may incorporate/include aspects of the CG circuitry 244b of FIG. 2B. For example, the output of the mux 210e in FIG. 2E may be used to drive the 'en' signal shown in FIG. 2B. Similarly, the output of the 'AND' gate 234b shown in FIG. 2B may correspond to the output of the CG circuit/cell 244e that is used to provide the clock signal input to the state registers (state_reg) of FIG. 2E. It is noted that a single instance of the CG circuitry 244b may be all that is required as part of the CG circuit/cell 244e in FIG. 2E, such that the inclusion of the CG circuit/cell 244e may represent relatively little hardware/overhead relative to a large number of elements 'N' in the array. Furthermore, it is noted that in FIG. 2E the outputs of the state registers (state_reg) are not provided as inputs to any of the other elements/logic of FIG. 2E, which may represent significant savings in terms of conductor, trace, or wiring utilization relative to capacity.

Figure 2F:
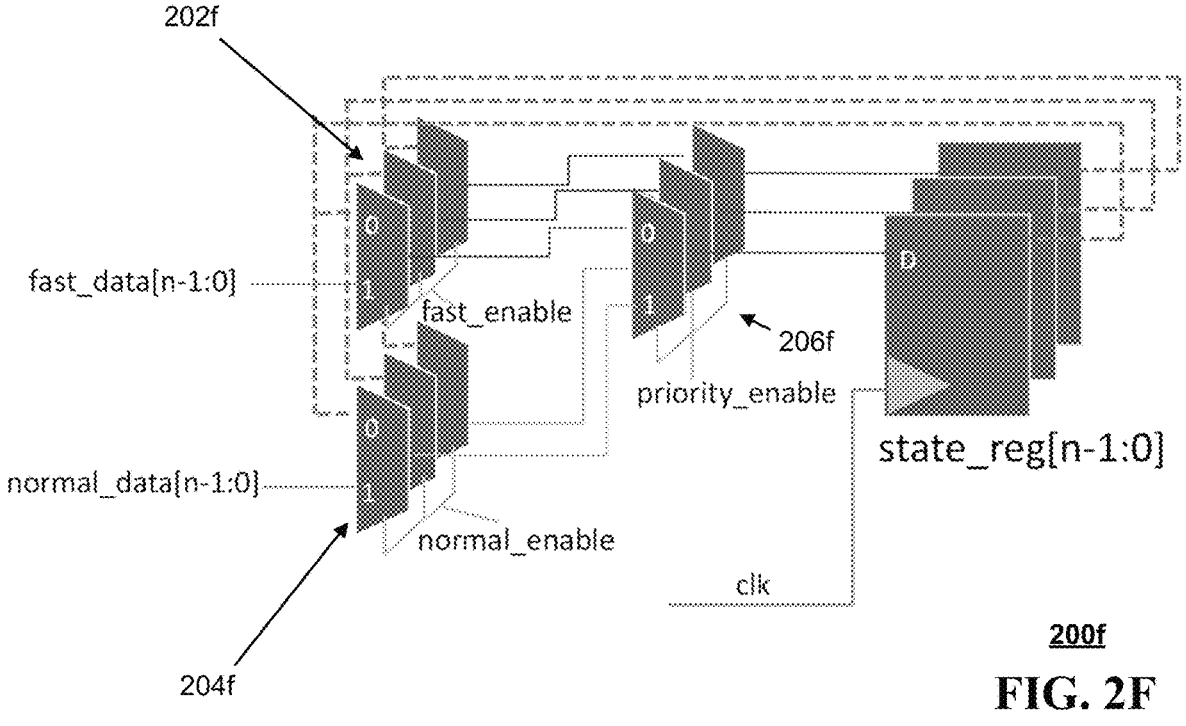

The savings/reduction of approximately 50% referred to above in transitioning from the system 200d to the system 200e may be even more pronounced in terms of a transition from the system 200f of FIG. 2F to the system 200e. For example, the system 200f may continue the theme of an array of registers or flip-flops (similar to the system 200d of FIG. 2D), but the system 200f may be based on the topology of the system 100 of FIG. 1 (whereas the system 200d is based on the topology of the system 200c of FIG. 2C). Thus, for an array of 'N' members/elements, instances of the muxes 102, 104, and 106 may be replicated as shown for arrays of muxes 202f, 204f, and 206f, respectively. Thus, the system 200f may incorporate 3*N (e.g., three times N) muxes. Relative to the system 200f, the system 200e may incorporate approximately 67% less muxes/hardware (ignoring the contributions of the mux 210e and the CG cell 244e in the system 200e).

Figure 3:
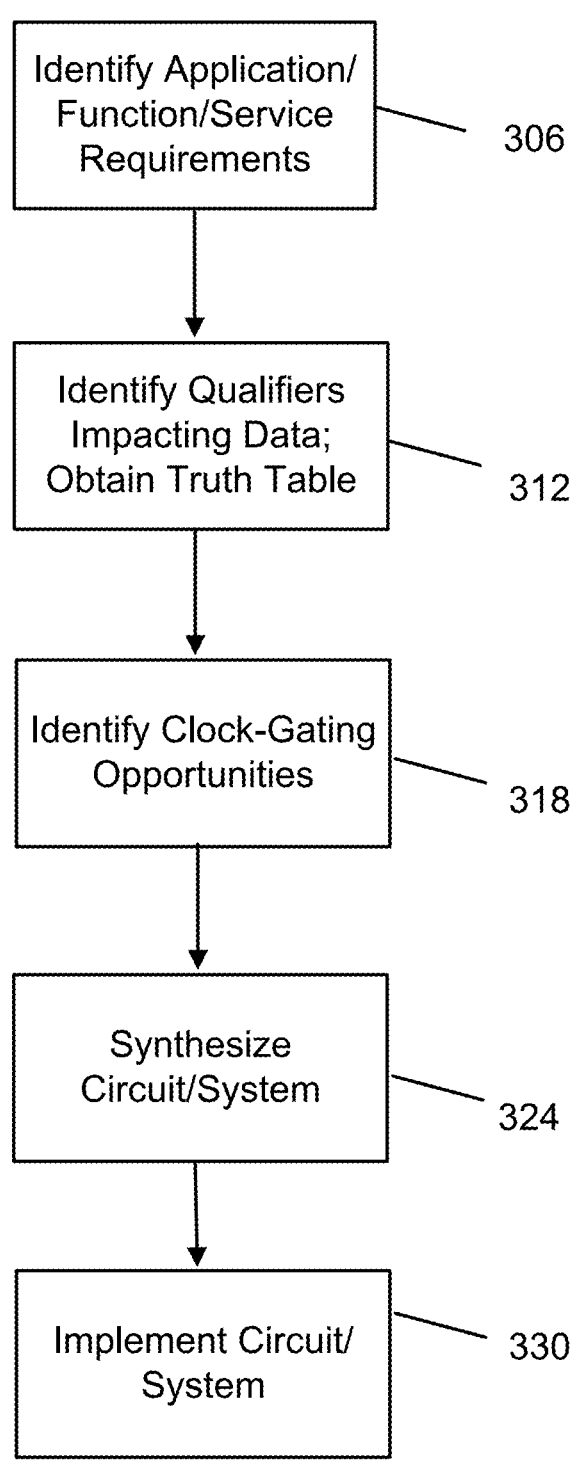
FIG. 3 depicts an illustrative embodiment of a method in accordance with various aspects described herein.

Referring now to FIG. 3, an illustrative embodiment of a method 300 in accordance with various aspects described herein is shown. The method 300 may be implemented or executed, in whole or in part, in conjunction with one or more systems, devices, and/or components, such as for example the systems, devices, and components set forth herein. In some embodiments, the method 300 may be executed, in whole or in part, in conjunction with one or more processing systems, where a processing system may include one or more processors. The various operations of the method 300 (represented by the blocks in FIG. 3) may be embodied as instructions that may be executed by the processing system(s) to facilitate the operations. The instructions may be stored by one or more elements or members, such as a memory or memory device, a computer or machine-readable medium (e.g., a transitory machine-readable medium, a non-transitory machine-readable medium, etc. The operations/blocks of the method 300 are described in further detail below.

In block 306, requirements associated with one or more applications, functions, or services may be identified. The identification of block 306 may be based on one or more specifications that are to be achieved/realized, and may be encountered as part of a design procedure or design phase whereby planning is undertaken to determine how to solve a particular problem or task at hand.

In block 312, one or more qualifiers may be identified that may impact data associated with the requirements. For example, as part of block 312 a truth table may be obtained (e.g., derived) on the basis of the qualifiers. Reference may be made to Table 1 hereinabove for an example of a truth table that may be generated as part of block 312 based on the qualifiers priority_enable, fast_enable, and normal_enable in respect of the data fast_data, normal_data and the data of the current state/output (as represented by 'Q' on the flip-flops of the various systems described above).

In block 318, one or more clock-gating opportunities may be identified. For example, as part of block 318 an analysis of the truth table of block 312 may be undertaken to generate information regarding when, or under what conditions, the current state/output is to be maintained. On the basis of such information, the circuit or system may be synthesized as part of block 324.

In block 330, the circuit or system may be implemented in accordance with the synthesis of block 324. For example, block 330 may include programming or configuring a device (e.g., a programmable logic device) based on the synthesis. In some embodiments, block 330 may include implementing the circuit or system as a gate-level physical implementation.

While for purposes of simplicity of explanation, the respective processes are shown and described as a series of blocks in FIG. 3, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein.

As demonstrated by the foregoing, aspects of this disclosure may reduce an amount of logic that may be required to support a function, an application, or a service. This reduction in logic may enable a reduction in steady-state/leakage power and may also enhance the efficiency of SoC and programmable logic devices by freeing-up capacity to accommodate other functionality. Furthermore, a use of CG circuits and systems may reduce the dynamic power dissipation/consumption of circuits and systems described herein, such as for example via a reduction in register or memory-state element power dissipation/consumption. In brief, aspects of this disclosure may be utilized to realize a reduction in power consumption/dissipation and a reduction in an amount of logic that may be required to support a given function, application, or service. In this respect, aspects of this disclosure are directed to, and provide for, a generation of, useful, concrete, and tangible results as part of various practical applications that represent substantial improvements relative to conventional technologies. Aspects of this disclosure may be applied in relation to environments where power consumption/dissipation is of a concern. Examples of such environments may include battery-powered environments (e.g., mobile device applications), automotive/automobile environments, etc.

Figure 4:
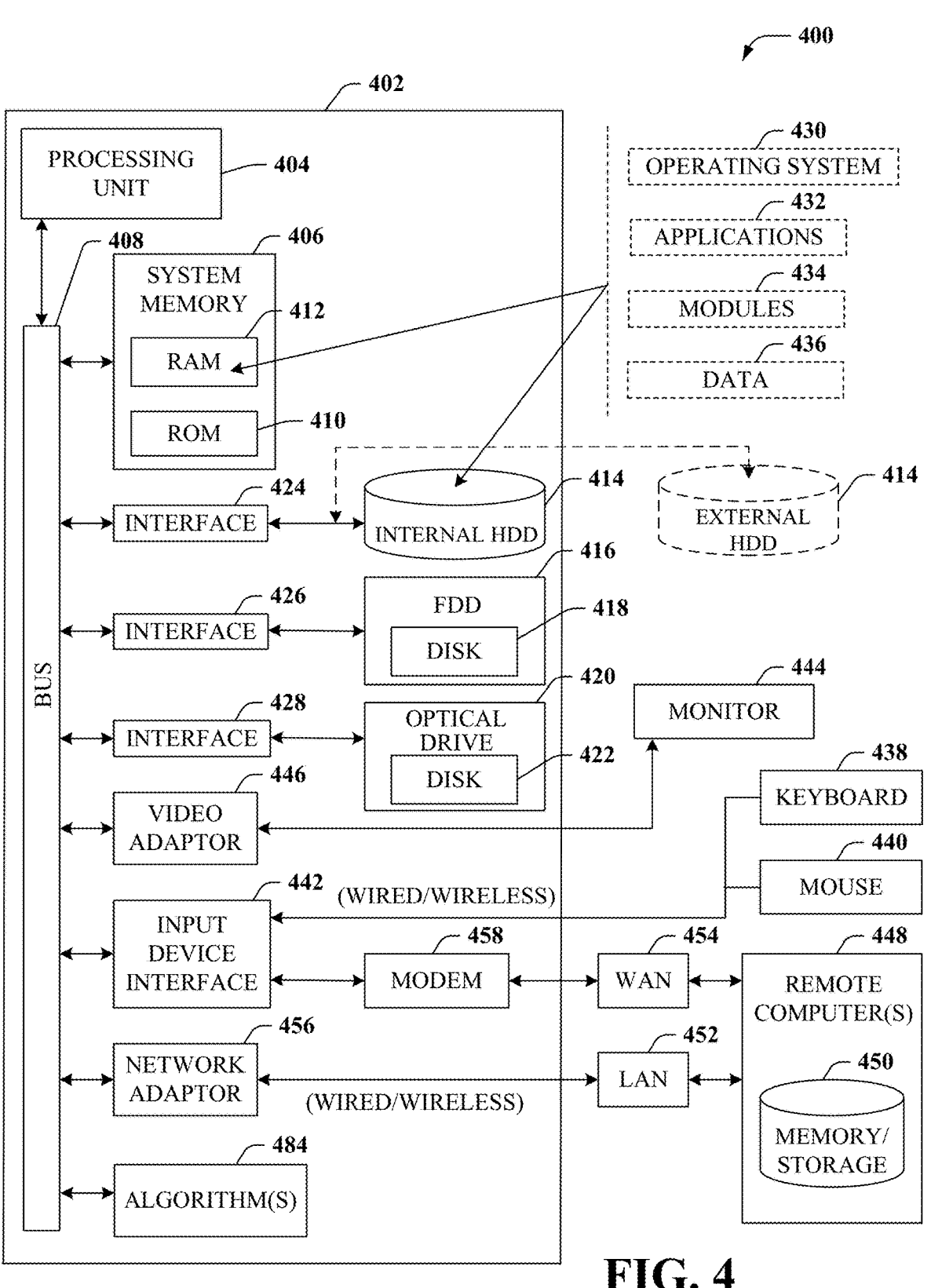
FIG. 4 is a block diagram of an example, non-limiting embodiment of a computing environment in accordance with various aspects described herein.

Turning now to FIG. 4, there is illustrated a block diagram of a computing environment 400 in accordance with various aspects described herein. In order to provide additional context for various embodiments of the embodiments described herein, FIG. 4 and the following discussion are intended to provide a brief, general description of a suitable computing environment 400 in which the various embodiments of the subject disclosure can be implemented. In particular, computing environment 400 can be used in the implementation of the method 300 of FIG. 3, where the method 300 may be executed/implemented to obtain a circuit or system topology (such as in relation to one or more of the circuits or systems described herein). Aspects of the components/devices shown in FIG. 4 can be implemented via computer-executable instructions that can run on one or more computers, and/or in combination with other program modules and/or as a combination of hardware and software.

Generally, program modules comprise routines, programs, components, data structures, etc., that perform particular tasks or implement particular data types. Moreover, those skilled in the art will appreciate that the methods can be practiced with other computer system configurations, comprising single-processor or multiprocessor computer systems, minicomputers, mainframe computers, as well as personal computers, hand-held computing devices, microprocessor-based or programmable consumer electronics, and the like, each of which can be operatively coupled to one or more associated devices.

As used herein, a processing circuit includes one or more processors as well as other application specific circuits such as an application specific integrated circuit, digital logic circuit, state machine, programmable gate array or other circuit that processes input signals or data and that produces output signals or data in response thereto. It should be noted that while any functions and features described herein in association with the operation of a processor could likewise be performed by a processing circuit.

The exemplary embodiments herein can be also practiced in distributed computing environments where certain tasks are performed by remote processing devices that are linked through a communications network. In a distributed computing environment, program modules can be located in both local and remote memory storage devices.

Computing devices typically comprise a variety of media, which can comprise computer-readable storage media and/ or communications media, which two terms are used herein differently from one another as follows. Computer-readable storage media can be any available storage media that can be accessed by the computer and comprises both volatile and nonvolatile media, removable and non-removable media. By way of example, and not limitation, computer-readable storage media can be implemented in connection with any method or technology for storage of information such as computer-readable instructions, program modules, structured data or unstructured data.

Computer-readable storage media can comprise, but are not limited to, random access memory (RAM), read only memory (ROM), electrically erasable programmable read only memory (EEPROM), flash memory or other memory technology, compact disk read only memory (CD-ROM), digital versatile disk (DVD) or other optical disk storage, magnetic cassettes, magnetic tape, magnetic disk storage or other magnetic storage devices or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and comprises any information delivery or transport media. The term "modulated data signal" or signals refers to a signal that has one or more of its characteristics set or changed in such a manner as to encode information in one or more signals. By way of example, and not limitation, communication media comprise wired media, such as a wired network or direct-wired connection, and wireless media such as acoustic, RF, infrared and other wireless media.

With reference again to FIG. 4, the example environment 400 can comprise a computer 402, the computer 402 comprising a processing unit 404, a system memory 406 and a system bus 408. The system bus 408 couples system components including, but not limited to, the system memory 406 to the processing unit 404. The processing unit 404 can be any of various commercially available processors. Dual microprocessors and other multiprocessor architectures can also be employed as the processing unit 404.

The system bus 408 can be any of several types of bus structure that can further interconnect to a memory bus (with or without a memory controller), a peripheral bus, and a local bus using any of a variety of commercially available bus architectures. The system memory 406 comprises ROM 410 and RAM 412. A basic input/output system (BIOS) can be stored in a non-volatile memory such as ROM, erasable programmable read only memory (EPROM), EEPROM, which BIOS contains the basic routines that help to transfer information between elements within the computer 402, such as during startup. The RAM 412 can also comprise a high-speed RAM such as static RAM for caching data.

The computer 402 further comprises an internal hard disk drive (HDD) 414 (e.g., EIDE, SATA), which internal HDD 414 can also be configured for external use in a suitable chassis (not shown), a magnetic floppy disk drive (FDD) 416, (e.g., to read from or write to a removable diskette 418) and an optical disk drive 420, (e.g., reading a CD-ROM disk 422 or, to read from or write to other high capacity optical media such as the DVD). The HDD 414, magnetic FDD 416 and optical disk drive 420 can be connected to the system bus 408 by a hard disk drive interface 424, a magnetic disk drive interface 426 and an optical drive interface 428, respectively. The hard disk drive interface 424 for external drive implementations comprises at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 402, the drives and storage media accommodate the storage of any data in a suitable digital format. Although the description of computer-readable storage media above refers to a hard disk drive (HDD), a removable magnetic diskette, and a removable optical media such as a CD or DVD, it should be appreciated by those skilled in the art that other types of storage media which are readable by a computer, such as zip drives, magnetic cassettes, flash memory cards, cartridges, and the like, can also be used in the example operating environment, and further, that any such storage media can contain computer-executable instructions for performing the methods described herein.

A number of program modules can be stored in the drives and RAM 412, comprising an operating system 430, one or more application programs 432, other program modules 434 and program data 436. All or portions of the operating system, applications, modules, and/or data can also be cached in the RAM 412. The systems and methods described herein can be implemented utilizing various commercially available operating systems or combinations of operating systems.

A user can enter commands and information into the computer 402 through one or more wired/wireless input devices, e.g., a keyboard 438 and a pointing device, such as a mouse 440. Other input devices (not shown) can comprise a microphone, an infrared (IR) remote control, a joystick, a game pad, a stylus pen, touch screen or the like. These and other input devices are often connected to the processing unit 404 through an input device interface 442 that can be coupled to the system bus 408, but can be connected by other interfaces, such as a parallel port, an IEEE 1394 serial port, a game port, a universal serial bus (USB) port, an IR interface, etc.

A monitor 444 or other type of display device can be also connected to the system bus 408 via an interface, such as a video adapter 446. It will also be appreciated that in alternative embodiments, a monitor 444 can also be any display device (e.g., another computer having a display, a smart phone, a tablet computer, etc.) for receiving display information associated with computer 402 via any communication means, including via the Internet and cloud-based networks. In addition to the monitor 444, a computer typically comprises other peripheral output devices (not shown), such as speakers, printers, etc.

The computer 402 can operate in a networked environment using logical connections via wired and/or wireless communications to one or more remote computers, such as a remote computer(s) 448. The remote computer(s) 448 can be a workstation, a server computer, a router, a personal computer, portable computer, microprocessor-based entertainment appliance, a peer device or other common network node, and typically comprises many or all of the elements described relative to the computer 402, although, for purposes of brevity, only a remote memory/storage device 450 is illustrated. The logical connections depicted comprise wired/wireless connectivity to a local area network (LAN) 452 and/or larger networks, e.g., a wide area network (WAN) 454. Such LAN and WAN networking environments are commonplace in offices and companies, and facilitate enterprise-wide computer networks, such as intranets, all of which can connect to a global communications network, e.g., the Internet.

When used in a LAN networking environment, the computer 402 can be connected to the LAN 452 through a wired and/or wireless communication network interface or adapter 456. The adapter 456 can facilitate wired or wireless communication to the LAN 452, which can also comprise a wireless AP disposed thereon for communicating with the adapter 456.

When used in a WAN networking environment, the computer 402 can comprise a modem 458 or can be connected to a communications server on the WAN 454 or has other means for establishing communications over the WAN 454, such as by way of the Internet. The modem 458, which can be internal or external and a wired or wireless device, can be connected to the system bus 408 via the input device interface 442. In a networked environment, program modules depicted relative to the computer 402 or portions thereof, can be stored in the remote memory/storage device 450. It will be appreciated that the network connections shown are example and other means of establishing a communications link between the computers can be used.

The computer 402 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This can comprise Wireless Fidelity (Wi-Fi) and BLUETOOTH® wireless technologies. Thus, the communication can be a predefined structure as with a conventional network or simply an ad hoc communication between at least two devices.

Wi-Fi can allow connection to the Internet from a couch at home, a bed in a hotel room or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE 802.11 (a, b, g, n, ac, ag, etc.) to provide secure, reliable, fast wireless connectivity. A Wi-Fi network can be used to connect computers to each other, to the Internet, and to wired networks (which can use IEEE 802.3 or Ethernet). Wi-Fi networks operate in the unlicensed 2.4 and 5 GHz radio bands for example or with products that contain both bands (dual band), so the networks can provide real-world performance similar to the basic 10BaseT wired Ethernet networks used in many offices.

In operation, the computing environment 400 may include or provide a processing system for an engineer, a designer, a technician, or the like (generally referred to herein as a user) to effectuate aspects of this disclosure as set forth herein. For example, the computing environment 400 may provide an interface (such as, for example, via the keyboard 438 or the mouse 440) to enter parameters or values pertaining to an application, a function, a service, or the like, and the computing environment 400 may generate and produce one or more outputs pertaining to circuit or system topologies that implement power and material/area savings in accordance with the various aspects of this disclosure. In FIG. 4, the methodologies or procedures, such as the type shown in FIG. 3, may be represented by algorithm(s) 484. The algorithm(s) 484 may be executed by, e.g., the processing unit 404, to effectuate one or more of the operations or methodological acts described herein. While shown separately, it will be understood and appreciated by one of skill in the art that the algorithm(s) 484 may be included or embodied as part of one or more entities, such as the memory 406, the disk 418 or the disk 422, the external HDD 414, the memory storage 450, etc.

The terms "first," "second," "third," and so forth, as used in the claims, unless otherwise clear by context, is for clarity only and does not otherwise indicate or imply any order in time. For instance, "a first circuit" and "a second circuit" does not indicate or imply that the first circuit is to be made before the second circuit, or vice versa, etc.

In the subject specification, terms such as "store," "storage," "data store," data storage," "database," and substantially any other information storage component relevant to operation and functionality of a component, refer to "memory components," or entities embodied in a "memory" or components comprising the memory. It will be appreciated that the memory components described herein can be either volatile memory or nonvolatile memory, or can comprise both volatile and nonvolatile memory, by way of illustration, and not limitation, volatile memory, non-volatile memory, disk storage, and memory storage. Further, nonvolatile memory can be included in read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

Some of the embodiments described herein can also employ artificial intelligence (AI) or machine learning (ML). AI and/or ML may facilitate automating one or more features described herein.

As used in some contexts in this application, the terms "component," "system" and the like are intended to refer to, or comprise, a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, computer-executable instructions, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components. While various components have been illustrated as separate components, it will be appreciated that multiple components can be implemented as a single component, or a single component can be implemented as multiple components, without departing from example embodiments.

Further, the various embodiments can be implemented as a method, apparatus or article of manufacture using standard programming and/or engineering techniques to produce software, firmware, hardware or any combination thereof to control a computer to implement the disclosed subject matter. The term "article of manufacture" as used herein is intended to encompass a computer program accessible from any computer-readable device or computer-readable storage/communications media. For example, computer readable storage media can include, but are not limited to, magnetic storage devices (e.g., hard disk, floppy disk, magnetic strips), optical disks (e.g., compact disk (CD), digital versatile disk (DVD)), smart cards, and flash memory devices (e.g., card, stick, key drive). Of course, those skilled in the art will recognize many modifications can be made to this configuration without departing from the scope or spirit of the various embodiments.

In addition, the words "example" and "exemplary" are used herein to mean serving as an instance or illustration. Any embodiment or design described herein as "example" or "exemplary" is not necessarily to be construed as preferred or advantageous over other embodiments or designs. Rather, use of the word example or exemplary is intended to present concepts in a concrete fashion. As used in this application, the term "or" is intended to mean an inclusive "or" rather than an exclusive "or". That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Furthermore, the term "user" can refer to human entities or automated components supported through artificial intelligence (e.g., a capacity to make inference based, at least, on complex mathematical formalisms), which can provide simulated vision, sound recognition and so forth.

As employed herein, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components or any combination thereof designed to perform the functions described herein. Processors can exploit nano-scale architectures such as, but not limited to, molecular and quantum-dot based transistors, switches and gates, in order to optimize space usage or enhance performance of user equipment. A processor can also be implemented as a combination of computing processing units.

What has been described above includes mere examples of various embodiments. It is, of course, not possible to describe every conceivable combination of components or methodologies for purposes of describing these examples, but one of ordinary skill in the art can recognize that many further combinations and permutations of the present embodiments are possible. Accordingly, the embodiments disclosed and/or claimed herein are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

Where applicable, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, where a particular flow diagram indicates a particular ordering of steps, other orderings are likewise possible provided that the principles of causality are maintained.

As may also be used herein, the term(s) "operably coupled to", "coupled to", "coupling", and the like include direct coupling between items and/or indirect coupling between items via one or more intervening items. Such items and intervening items include, but are not limited to, junctions, communication paths, components, circuit elements, circuits, functional blocks, and/or devices. As an example of indirect coupling, a signal conveyed from a first item to a second item may be modified by one or more intervening items by modifying the form, nature or format of information in a signal, while one or more elements of the information in the signal are nevertheless conveyed in a manner than can be recognized by the second item. In a further example of indirect coupling, an action in a first item can cause a reaction on the second item, as a result of actions and/or reactions in one or more intervening items.

Although specific embodiments have been illustrated and described herein, it should be appreciated that any arrangement which achieves the same or similar purpose may be substituted for the embodiments described or shown by the subject disclosure. The subject disclosure is intended to cover any and all adaptations or variations of various embodiments. Combinations of the above embodiments, and other embodiments not specifically described herein, can be used in the subject disclosure. For instance, one or more features from one or more embodiments can be combined with one or more features of one or more other embodiments. In one or more embodiments, features that are positively recited can also be negatively recited and excluded from the embodiment with or without replacement by another structural and/or functional feature. The steps or functions described with respect to the embodiments of the subject disclosure can be performed in any order. The steps or functions described with respect to the embodiments of the subject disclosure can be performed alone or in combination with other steps or functions of the subject disclosure, as well as from other embodiments or from other steps that have not been described in the subject disclosure. Further, more than or less than all of the features described with respect to an embodiment can also be utilized.

We claim:

1. A system comprising:
   a plurality of memory-state elements;
   a plurality of multiplexers, wherein an output of each multiplexer of the plurality of multiplexers interfaces to an input of a corresponding memory-state element of the plurality of memory-state elements, wherein each multiplexer of the plurality of multiplexers includes at least two data inputs, and wherein the at least two data inputs of each multiplexer are associated with a data-path of data having an associated plurality of qualifiers; and
   a clock-gated circuit that generates a first output that is coupled to a clock input of each of the plurality of memory-state elements;
   wherein a respective control input that provides for a selection amongst a respective plurality of inputs coupled to each of the plurality of multiplexers and a control input that provides for selection amongst a plurality of inputs coupled to a multiplexer having an output coupled to the clock-gated circuit are driven from a common signal.

2. The system of claim 1, wherein the plurality of memory-state elements includes D- type flip-flops.

3. The system of claim 1, wherein the clock-gated circuit includes a latch.

4. The system of claim 3, wherein the latch is operative on a basis of a first polarity of a clock signal, and wherein the clock input of each of the plurality of memory-state elements is operative on a basis of a second polarity of the clock signal, the second polarity being different from the first polarity.

5. The system of claim 4, wherein the clock-gated circuit includes a gate, wherein a second output of the latch is coupled to a first input of the gate, and wherein the clock signal is coupled to a second input of the gate.

6. The system of claim 5, wherein the gate is an AND gate.

7. The system of claim 1, wherein the clock-gated circuit is driven by a control signal.

8. The system of claim 7, further comprising:
   the multiplexer that provides the control signal.

9. The system of claim 8, wherein a count of the plurality of multiplexers is at least ten multiplexers.

10. The system of claim 1, wherein a first data input of the at least two data inputs corresponds to first data that changes at a first rate and a second data input of the at least two data inputs corresponds to second data that changes at a second rate.

11. The system of claim 10, wherein the first rate is greater than the second rate.

12. A circuit comprising:

a plurality of flip-flops;

first logic that provides respective data at a first input of each flip-flop of the plurality of flip-flops, wherein the first logic does not obtain outputs of the flip-flops as inputs; and second logic that clock-gates a clock signal in respect of a second input of each of the plurality of flip-flops;

wherein the first logic includes a plurality of multiplexers;

wherein the second logic is driven from an output of a multiplexer;

wherein a respective control input that provides for a selection amongst a respective plurality of inputs coupled to each of the plurality of multiplexers and a control input that provides for selection at the multiplexer are driven from a common signal.

13. The circuit of claim 12, wherein the plurality of flip-flops includes a plurality of D-type flip-flops.

14. The circuit of claim 12, wherein the second input corresponds to a clock input.

15. A method, comprising:

identifying, by a processing system including a processor, a plurality of qualifiers that impact data of an application, resulting in a first identification;

identifying, by the processing system and based on the first identification, at least one clock-gating opportunity in respect of a circuit to implement the application, resulting in a second identification; and synthesizing, by the processing system and based on the second identification, the circuit, wherein the identifying of the plurality of qualifiers comprises generating a truth table, and wherein the identifying of the at least one clock-gating opportunity comprises analyzing the truth table.

16. The method of claim 15, comprising:

programming, by the processing system and based on the synthesizing, the circuit into a device.

\* \* \* \* \*